United States Patent
Blackburn et al.

(10) Patent No.: US 9,822,451 B2
(45) Date of Patent: Nov. 21, 2017

(54) DEVICE AND METHOD FOR MANUFACTURING NANOSTRUCTURES CONSISTING OF CARBON

(71) Applicant: AIXTRON SE, Herzogenrath (DE)

(72) Inventors: Ian Blackburn, Northants (GB); Brian Lu, Fremont, CA (US); Kenneth Teo, Cambridge (GB); Nalin Rupesinghe, Cambridge (GB)

(73) Assignee: AIXTRON SE, Herzogenrath (DE)

( * ) Notice: Subject to any disclaimer, the term of this patent is extended or adjusted under 35 U.S.C. 154(b) by 10 days.

(21) Appl. No.: 14/547,720

(22) Filed: Nov. 19, 2014

(65) Prior Publication Data

US 2015/0140234 A1    May 21, 2015

(30) Foreign Application Priority Data

Nov. 21, 2013   (DE) .................. 10 2013 112 855

(51) Int. Cl.
| | | |
|---|---|---|
| *C23C 16/00* | (2006.01) | |
| *C23C 16/50* | (2006.01) | |
| *C23C 16/455* | (2006.01) | |
| *C23C 16/515* | (2006.01) | |
| *C23C 16/46* | (2006.01) | |
| *C23C 16/26* | (2006.01) | |

(Continued)

(52) U.S. Cl.
CPC .......... *C23C 16/50* (2013.01); *C01B 31/0206* (2013.01); *C23C 16/26* (2013.01); *C23C 16/452* (2013.01); *C23C 16/455* (2013.01); *C23C 16/45565* (2013.01); *C23C 16/46* (2013.01); *C23C 16/515* (2013.01)

(58) Field of Classification Search
USPC ....................................... 118/724, 725, 723 E
See application file for complete search history.

(56) References Cited

U.S. PATENT DOCUMENTS 5,058,527 A * 10/1991 Ohta ................. C23C 16/45565
                                                    118/715
6,045,877 A *  4/2000 Gleason ................... B05D 1/60
                                                    427/255.18

(Continued)

FOREIGN PATENT DOCUMENTS

JP          3746639 B2    2/2006

*Primary Examiner* — Sylvia R MacArthur
*Assistant Examiner* — Anna Crowell
(74) *Attorney, Agent, or Firm* — Ascenda Law Group, PC

(57) ABSTRACT

A device for manufacturing nanostructures consisting of carbon, such as monolayers, multilayer sheet structures, tubes, or fibers includes a gas inlet element having a housing cavity enclosed by housing walls, into which a gas feed line opens, through which a gaseous, in particular carbonaceous starting material can be fed into the housing cavity, having a plasma generator, which has components arranged at least partially in the housing cavity, which has at least one plasma electrode to which electrical voltage can be applied, to apply energy to the gaseous starting material by igniting a plasma and thus converting the gaseous starting material into a gaseous intermediate product, and having a gas outlet surface having a plurality of gas outlet openings, through which the gaseous intermediate product can exit out of the housing cavity. A gas heating unit is provided for assisting the conversion, which is arranged downstream of the components.

12 Claims, 3 Drawing Sheets

(51) Int. Cl.
*C23C 16/452* (2006.01)
*C01B 31/02* (2006.01)

(56) References Cited

U.S. PATENT DOCUMENTS

| | | | |
|---|---|---|---|
| 6,161,499 A | 12/2000 | Sun et al. | |
| 6,499,425 B1 | 12/2002 | Sandhu et al. | |
| 8,048,483 B2 | 11/2011 | Yoon et al. | |
| 8,230,807 B2* | 7/2012 | Alcott | B05D 1/60 118/715 |
| 8,398,927 B2* | 3/2013 | Yamazaki | B82Y 30/00 422/186.04 |
| 8,741,396 B2 | 6/2014 | Ishikawa et al. | |
| 2001/0052596 A1* | 12/2001 | Meiling | C23C 16/24 257/57 |
| 2005/0217582 A1* | 10/2005 | Kim | C23C 16/45514 118/723 E |
| 2006/0185595 A1* | 8/2006 | Coll | B82Y 30/00 118/724 |
| 2006/0228827 A1* | 10/2006 | Kim | C23C 16/45565 438/82 |
| 2007/0135014 A1* | 6/2007 | Choi | B82Y 10/00 445/49 |
| 2008/0223297 A1* | 9/2008 | Choo | C23C 16/26 118/620 |
| 2010/0209704 A1* | 8/2010 | Yamazaki | B82Y 30/00 428/368 |
| 2012/0115314 A1* | 5/2012 | Sakamoto | C23C 16/24 438/479 |
| 2014/0060740 A1* | 3/2014 | Huang | H01J 37/32082 156/345.44 |

* cited by examiner

DEVICE AND METHOD FOR MANUFACTURING NANOSTRUCTURES CONSISTING OF CARBON

RELATED APPLICATIONS

This application claims priority to DE Application 10 2013 112 855.6 filed 21 Nov. 2013.

FIELD OF THE INVENTION

The invention firstly relates to a device for manufacturing nanostructures consisting of carbon, such as monolayers, multilayer structures (multilayer sheets) or tubes or fibers, having a gas inlet element having a housing cavity enclosed by housing walls, into which a gas feed line opens, through which a gas mixture containing, for example, a gaseous, carbonaceous starting material can be fed into the housing cavity, having a plasma generator arranged in the housing cavity having at least one plasma electrode to which electrical voltage can be applied, to convert the gaseous starting material by application of energy into a gaseous intermediate product, and having a gas outlet surface, which has a plurality of gas outlet openings (7), through which the gaseous intermediate product can exit out of the housing cavity.

The invention additionally relates to a method for manufacturing nanostructures consisting of carbon using this device.

BACKGROUND

Carbon can be deposited in various crystal structures. For example, in the form of a diamond structure, as a monolayer, multilayer structure (multilayer sheets) such as graphene, as tubes such as "carbon nanotubes", or as fullerene or as fibers. CVD devices are used to deposit such carbon structures, in particular nanostructures, which have structure sizes in at least one dimension from a fraction of a nanometer up to several hundred nanometers. In this case, together with a carrier gas, for example, argon or hydrogen, a carbonaceous starting material, for example, methane or acetylene, is introduced into the process chamber of the CVD reactor. Activating or dissociating the introduced carbonaceous starting materials thermally or by means of a plasma is known. For example, U.S. Pat. No. 8,398,927 B2 describes a plasma-enhanced CVD (PE-CVD) and US 2006/0185595 A1 describes a hot filament CVD (HF-CVD). In the case of the PE-CVD, a plasma is ignited inside a gas inlet element. For this purpose, the device has a plasma electrode to which electrical voltage is applied. In this way, radicals are generated, which can enter through the gas outlet opening of the gas inlet element into a process chamber, where they are deposited on a substrate arranged on a heating element with formation of the nanostructures. In the case of the HF-CVD, the carbonaceous starting material is heated using a hot filament inside or also outside a gas inlet element. In the case of the HF-CVD, a plasma, using which radicals are generated, can be ignited directly above the substrate. The ignition of a plasma directly above the substrate is disadvantageous, however, since high-energy ions form in the plasma, which have an etching effect on the substrate.

Devices for depositing carbonaceous structures using a plasma are also known from U.S. Pat. No. 6,499,425 or U.S. Pat. No. 6,161,499.

SUMMARY OF THE INVENTION

The invention is based on the object of improving the known device or the known method with the goal of improved manufacturing of nanostructures consisting of carbon.

The object is achieved by the invention specified in the claims. According to the invention, a plasma is ignited inside the gas inlet element. Furthermore, a gas heater is used to associate or dissociate the gaseous starting material. The advantages of HF-CVD and PE-CVD are utilized to a certain extent, so that reaction products form in a combination of a plasma dissociation of the gaseous starting material and a thermal activation/reaction or a thermal treatment of the gas within the gas phase. The preferred use of a carbonaceous starting material results in a formation of polymeric and/or aromatic components. In particular polymeric and/or aromatic radicals form. The plasma generator preferably has grounded guard electrodes, using which ions forming during the dissociation can be neutralized or captured. The use of a guard electrode also results in a reduction of energy of the ions. The gas inlet element according to the invention or the gas distributor used according to the invention is preferably implemented as a "showerhead". The generation of the radicals takes place due to the use of both a plasma and also the heat supply. It can be generated using a plurality of latticed plates, wherein both the plasma electrode to which electrical voltage can be applied and also the guard electrodes arranged upstream and/or downstream of the plasma electrode are formed as plates having a plurality of openings. The openings of the plates can be arranged offset to one another, so that improved gas mixing results. The gas heater is also formed by a latticed structure, but it has two electrodes, to conduct a flow heated by the plate through the plate. The gas heater can also be formed in a meander shape, however, it can be formed as a winding and can have two or more electrodes, so that the heating element can be heated using an electric current. All plates lie transversely to the flow direction of the gas and preferably extend over the entire cross-sectional area of the gas inlet element. The gas heater is in particular a planar object, which is arranged transversely in relation to the flow direction. The gas heater can be arranged inside the gas inlet element, in the region of the gas outlet surface, or directly downstream of the gas outlet surface. The extension direction of the gas heater extends transversely in relation to the flow direction of the gas stream. The plates have regularly arranged openings. The openings can have a rectangular, round, or elongated cross-section. The gas heater is capable of heating the gas passing through it, so that the gas temperature is raised.

In a first variant, the plasma electrode can simultaneously form the heating element. In this case, not only is an electrical high voltage, which is used to generate the plasma, applied to the plasma electrode. A current is also conducted through the plate, which heats up the plate, so that not only is a plasma generated using this heated plate, but rather also the gas is heated. Plasma activation and thermal activation therefore take place at the same location.

In a second variant of the invention, the plasma electrode is spatially separated from the heating unit. The heating unit can be arranged downstream of the plasma generator. The plates which form the electrodes can consist of metal, in particular highly-reflective metal. The wall of the gas outlet surface facing toward the housing cavity can also be formed to be heat reflective. The electrically preloaded plasma electrode can be arranged between two grounded guard electrodes. In this way, the external region of the housing cavity is protected against ion bombardment.

In a third variant, the gas heater is located directly downstream of the gas outlet surface. A plate having holes, which consists of an insulating material, is located downstream of the gas heater. The gas outlet surface and the side wall of the gas inlet element consist of an electrically conductive material and are grounded, as are two guard plates arranged inside the gas inlet element downstream of the plasma electrode. A perforated plate made of an insulating material can be located between a grounded guard electrode arranged upstream of the plasma electrode.

In a fourth variant of the invention, the gas inlet element is formed by an electrically conductive hollow body. The hollow body has a cylindrical shape and a circular outline. An upper end side of the cylinder is lined on its inner side with an insulating plate. The insulating plate can also more or less form the cover of the gas inlet element. On its inner side, the insulating plate carries the plasma electrode, to which an AC voltage or a DC voltage, in particular at a high voltage can be applied, and through which gas does not flow in this exemplary embodiment. Inside the housing cavity of the gas inlet element, two plates extending parallel to one another and parallel to the end walls of the gas inlet element are located, which are made of an electrically conductive material and which have gas passage openings. The plates are fastened using holding rods on the cover of the gas inlet element and are grounded via the holding rods. The holding rods engage in this case through openings in the plasma electrode and the insulating body, against which the plasma electrode presses. The gas heating unit is located here outside the gas inlet element. The heating unit is formed by a flat metal strip, which is structured within a plane which extends in parallel to the gas outlet plane. The metal strip can extend in a meander shape. However, it can also extend in a spiral around the center of the heating plate, which is in the shape of a circular disk. The cover of the process chamber is formed in this exemplary embodiment by an insulating plate having gas passage openings. This plate also has the shape of a circular disk. It is seated directly downstream of the gas heating surface. The plate is manufactured from an insulating material. The susceptor, which can be heated by a heating unit or cooled by means of a cooling unit, is located below this plate. The substrate lies on the temperature-controllable susceptor.

The gas inlet element according to the invention is part of a CVD reactor, which has a gas-tight reactor housing, in which the gas inlet element is located. The gas inlet element has on its lower side the gas outlet surface, which has a plurality of gas outlet openings, so that the gas inlet element is formed like a showerhead. Gas distribution takes place using the gas inlet element. The process chamber, the bottom of which is implemented by a heatable susceptor, is located below the gas inlet element. The at least one substrate, which can consist of glass, lies on the susceptor. The carbon nanostructures, for example, graphene or "carbon nanotubes" are deposited on the substrate. The substrate can also be a wafer or a film. It can consist of glass, quartz, metal, ceramic, or a polymer and of silicon.

To carry out the method, a gas mixture is fed into the gas inlet element through the gas feed line. It can be a carrier gas, for example, hydrogen or argon. In addition, a carbon carrier, for example, methane or acetylene, can be fed through the gas inlet element. A gaseous starting material is chemically converted inside the reaction chamber of the gas inlet element. In particular, a conversion of a carbonaceous starting material takes place. This is performed, for example, by applying heat to methane and by a plasma. Intermediate products such as atomic or ionized radicals arise in this case. These can be aromatic or polymeric intermediate products in this case. These intermediate products, which contain carbon atoms, are introduced using a carrier gas through the gas outlet openings into the process chamber, where they are deposited on the substrate. For this purpose, the substrate is heated to a temperature between 300 and 1200° C. The gas feed of the carbonaceous starting material can take place in pulsed form. However, it can also be provided that the carbonaceous starting material is continuously fed into the gas inlet element. The plasma can be generated continuously by an AC voltage or by a DC voltage. However, the plasma can also only be ignited in pulses. The plasma electrode is brought to a voltage of 300 to 1500 V to generate the plasma. If the plasma electrode is simultaneously the heating element, the heating voltage has a correspondingly high potential, since the plasma power source and the heating power source are connected to one another. The plasma generator and the gas heating unit can also be used to generate a cleaning gas. Before or after a coating step, a cleaning step is carried out, during which a neutral gas is converted into cleaning radicals, for example, inside the gas inlet element. Using these cleaning radicals, particles accumulated in the process chamber or in the housing cavity of the gas inlet element can be removed. A typical method can have one of the following process steps:

a) an oxidation step, in which oxygen atoms or ions are formed using the gas inlet element according to the invention, to oxidize substrates or layers deposited on the substrates;

b) a reduction step, in which reducing agents such as hydrogen or ammonia are converted into atoms, ions, or radicals, to reduce substrates or layers deposited on the substrates;

c) a growth step, in which a gas mixture, which comprises a carbonaceous component, for example, methane, ethylene, or acetylene, is converted into atoms, ions, aromatic radicals, or polymeric radicals, to deposit carbon nanomaterial;

d) a post-processing step, in which reducing or dopant gases are used.

BRIEF DESCRIPTION OF THE DRAWINGS

Exemplary embodiments of the invention are explained hereafter on the basis of appended drawings. In the figures.

DETAILED DESCRIPTION

Figure 1:
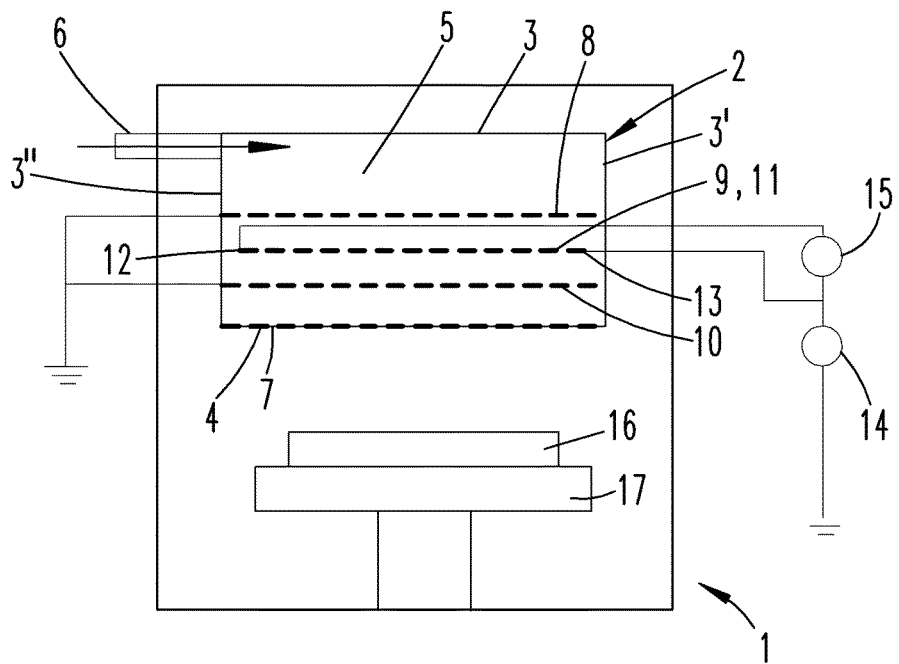
FIG. 1 shows a schematic illustration of a CVD reactor according to a first exemplary embodiment.

The CVD reactors illustrated in the drawings each have a gas-tight reactor housing 1. A susceptor 17, which is heatable to a process temperature between 300 and 1200°, is located inside the reactor housing 1. On the upward facing upper side of the susceptor 17, a substrate 16 is located, on the upward facing upper side of which carbon nanostructures in the form of graphene or carbon nanotubes or also graphene monolayers or graphene multilayer sheets or fibers are to be deposited.

The gas outlet surface 4 of a gas inlet element 2 extends above and at a distance to the susceptor. The gas outlet surface 4 has a plurality of gas outlet openings 7 arranged in a lattice network. The gas inlet element 2 has a design which is similar to a showerhead, so that the gas inlet element 2 is also referred to as a showerhead.

A gas feed line 6 opens into the gas inlet element 2. There can also be multiple gas feed lines if multiple process gases different from one another are to be fed into the gas inlet element 2. The process gases are provided in a gas mixing system (not shown).

The gas inlet element 2 is enclosed all around by walls 3, 3', 3". A housing cavity 5, which represents a reaction chamber, in which a precursor reaction of the gases takes place, during which, for example, carbonaceous gases are dissociated and aromatic or polymeric intermediate products form, is located inside the walls 3, 3', 3", 4 of the gas inlet element 2. The intermediate products are radicals in particular. They are transported with the aid of the carrier gas through the gas outlet openings 7 to the substrate 16, where they are deposited while forming the nanostructures consisting of carbon, in particular graphene layers or tubes.

Multiple plates 8, 9, 10, 11, which extend in parallel to one another and in parallel to the gas outlet surface 4, are located inside the housing cavity 5 of the gas inlet element 2. These plates extend over the entire cross section of the housing cavity 5 and have a plurality of regularly arranged openings. To improve gas mixing, the openings are different from one another and adjacent plates are arranged offset to one another.

The plate 9 is insulated in relation to the housing of the gas inlet element 2 and high-voltage alternating current or direct current is applied thereto by means of a high-voltage source 14, so that a plasma can form inside the housing cavity 5. The plasma electrode 9 lies between two guard electrodes 8, 10, which are each grounded.

A heating element 11 is provided. The heating element 11 has two contacts 12, 13, which are connected to a heating voltage source 15, so that an electric current can flow through the heating element 11, which heats the heating element 11 because of its resistance. The plates 8 and 10 directly adjacent to the heating element 11 and the inner wall of the gas outlet surface 4 can be implemented as heat-reflective.

In the exemplary embodiment illustrated in FIG. 1, the heating element is formed by the plasma electrode 9 itself. The heating current source 15 is connected in series here to the plasma voltage source 14, so that an electric current, which heats up the plasma electrode 9, can flow through the plasma electrode 9, which has the terminal electrodes 12, 13.

Figure 2:
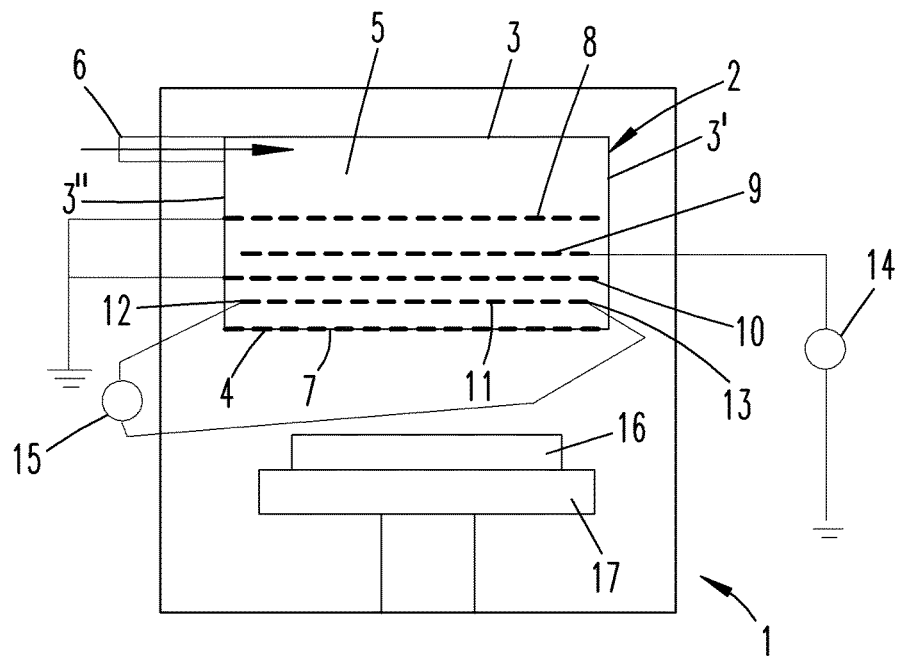
FIG. 2 shows the schematic illustration of a CVD reactor according to a second exemplary embodiment.

In the exemplary embodiment illustrated in FIG. 2, plasma electrode 9 and heating element 11 are spatially separated from one another. The heating element 11 lies here between the lower guard electrode 10 and the gas outlet surface 4, which extends parallel to the guard electrode 10 and is formed by the lower wall of the gas inlet element 2. The current source 15 is also separated from the voltage source 14 here.

While the guard electrodes 8, 10 are used as reflectors for the heat emitted from the heating element 11 in the exemplary embodiment illustrated in FIG. 1, the guard electrode 10 and the lower wall of the gas inlet element 2 are used as reflectors in the exemplary embodiment illustrated in FIG. 2.

The heating element 11 can be a plate. It can also be a meander-shaped element or a coil, in particular a flat coil.

Figure 3:
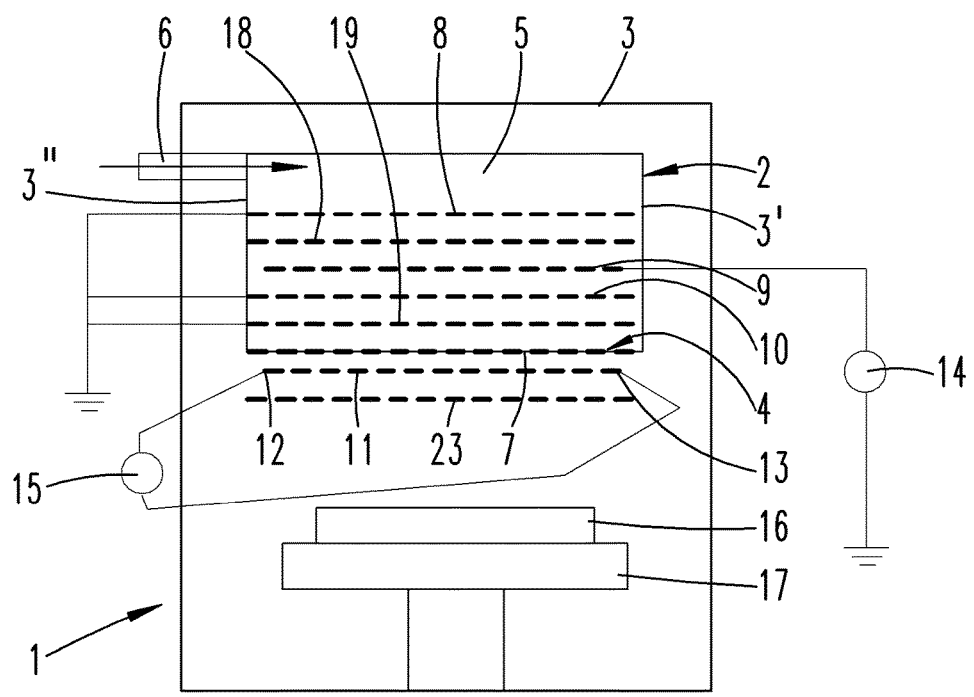
FIG. 3 shows a third exemplary embodiment of the invention.

The third exemplary embodiment shown in FIG. 3 has a reactor housing 1, which can have a cylinder shape having circular footprint. A susceptor 17, which can have a heater or a cooling unit, is located inside the reactor housing 1.

A substrate 16 to be coated is located on the susceptor 17.

A plate 23, which has gas passage openings and which is manufactured from an insulating material, extends over the entire area of the susceptor 17 at a vertical distance above the susceptor 17. At a slight distance above the plate 23, a metallic, flat, spiral, or meandering strip extends, which forms contacts 12, 13 at its ends. The strip forms a heating element 11 extending over the cylinder surface, which can be supplied with electrical power by a heating voltage source 15.

The gas outlet surface 4 of the gas inlet element 2 extends in a parallel layer above the heating element 11, which extends parallel to the plate 23. The gas outlet surface 4 has a plurality of gas outlet openings 7. The housing of the gas inlet element 2 consists of metal and is grounded.

Directly above the gas outlet opening 7, i.e., inside the housing cavity 5 of the gas inlet element 2, two metallic plates 10, 19, which are grounded, extend in parallel to the gas outlet surface 4. Upstream of the pair of these guard plates 10, 19, the plasma electrode 9 extends, which is supplied with voltage by a high-voltage source 14, to form a plasma inside the cavity 5 of the gas inlet element 2.

Upstream of the plasma electrode 9, which extends over the entire cross-sectional area of the housing cavity 5, a further insulator plate 18 having gas passage openings is located. A further metallic grounding plate, also having passage openings, is located upstream of the insulator plate 18.

The gas stream flowing in through the gas feed line 6, which contains the above-described process gases, enters the housing cavity 5 and passes the openings of the plates 8, 18, 9, 10, 19 arranged inside the housing cavity 5 and exits from the gas inlet element 2 through the gas outlet opening 7. A plasma is generated using the plasma electrode 9 provided inside the housing cavity 5. This plasma is spatially restricted to the region between the grounded plates 8 and 10. The plasma electrode 9 lies between two grounded electrodes 8, 10, wherein an insulator plate 18, which is manufactured from an insulating material, is located between the grounded guard plate 8 arranged above the plasma electrode 9 and the plasma electrode 9. Physical decomposition, or at least ionization of the process gases, is performed using the plasma. The process gases which are dissociated or excited in this manner exit from the gas exit openings 7 out of the gas outlet surface 4 and are thermally activated during the passage through the gaps between the heated surface elements of the heating element 11. The starting materials thermally activated in this manner pass through the gas outlet openings of the insulating plate 23 into the process chamber, which is located between the insulating plate 23 and the susceptor 17.

Figure 4:
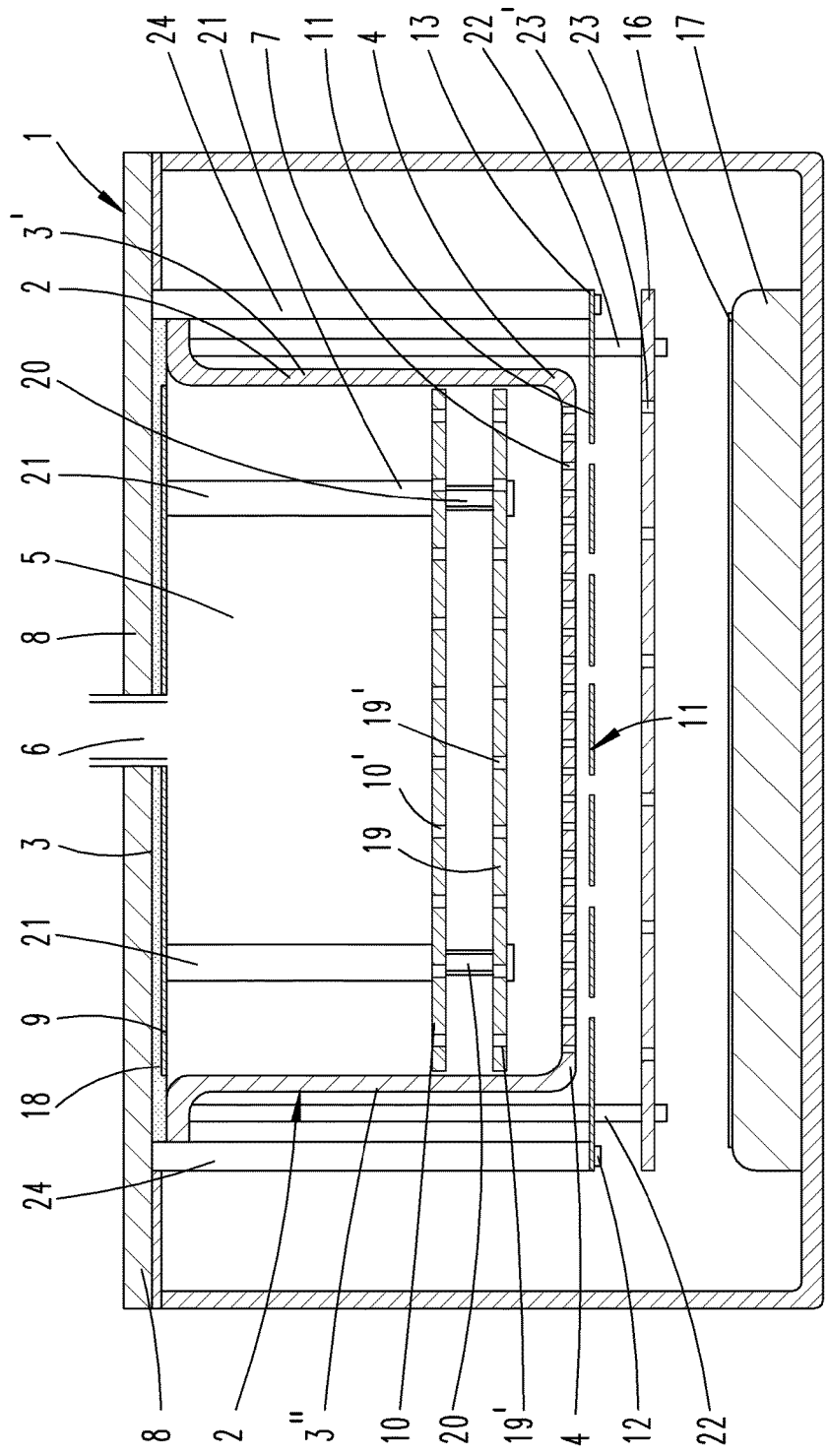
FIG. 4 shows a fourth exemplary embodiment of the invention.

In the fourth exemplary embodiment illustrated in FIG. 4, the gas inlet element 2 also consists of a metallic hollow body, which has gas outlet openings 7 on its end side. Two guard electrodes 10, 19, which are spaced apart from one another and consist of metal, are also located here inside the housing cavity 5. These guard electrodes are fastened using electrically conductive rods 20, 21 to an electrically conductive and grounded cover plate 8.

A plate 18 manufactured from an insulating material extends below the cover plate 8. The plate 18 lies in touching contact on the cover plate 8.

The planar plasma electrode 9, to which a voltage source can apply voltage, lies in touching contact on the insulating plate 18. The plasma electrode 9 and the insulating plate 18 have openings, through which the holding rods 21 pass. These openings are not shown in FIG. 4.

The gas heater is arranged in this exemplary embodiment outside the gas inlet element 2. It consists of a thin metal plate, which has slots extending in a meandering or spiral shape. In this way, a thin metal strip results, which is fastened at its ends to terminal contacts 12, 13. The terminal contacts 12, 13 can be seated at the end of holding rods 24, using which the heating element 11 is held at a slight distance below the gas outlet opening 7. The power supply of the heating element 11 is performed through the holding rods 24. The holding rods 24 can be enclosed using insulation (not shown) and can penetrate the plate 8 in insulated form, so that current can be conducted through the holding rods 24 from the outside.

A plate 23 in the form of a circular disk, which is made of an insulating material and which is also fixed using holding rods, extends between the surface of a susceptor 17 and the heating element 11. The insulator plate 23 has openings 23', through which the dissociated and thermally excited process gas can flow in the direction toward the substrate 16 lying on the susceptor 17.

The introduction of the process gas is also performed here through a gas feed line 6 into the housing cavity 5 of the gas inlet element 2. A plasma forms between the grounded plates 10, 19 and the plasma electrode 9 insulated therefrom. The ionized or dissociated starting materials exit from the gas outlet openings 7 into a thermal excitation zone, in which the heating element 11 is located. The thermal excitation zone is delimited in the direction toward the susceptor 17 by the insulating plate 23, through the openings 23' of which the thermally activated starting materials exit in the direction of the substrate 16. The plasma electrode 9 also has at least one opening, through which the process gas can pass, in this exemplary embodiment.

The above statements are used to explain the inventions comprised by the application as a whole, which each independently refine the prior art at least by way of the following combinations of features, as follows:

A device, characterized by a gas heating unit 11 for assisting the conversion, which is arranged downstream of the components 8, 9, 10.

A device, which is characterized in that a gas inlet element 2 is arranged in a process chamber of a CVD reactor 1, which has a heatable susceptor 17, which is a carrier for accommodating one or more substrates 16, wherein the susceptor 17 is associated with the bottom of a process chamber and the gas outlet surface 4 is associated with the cover of the process chamber, which process chamber being formed so that the gaseous intermediate products exiting from the gas outlet surface 4 are transported to the at least one substrate 16, on which the nanostructures are deposited.

A device, which is characterized in that a plasma electrode 9 has the form of a lattice or a plate, which is arranged in the flow path of the gaseous starting material or on the upper wall 3 of the gas inlet element 2.

A device, which is characterized by one or more guard electrodes 10, 19 in the form of a lattice arranged in the flow path of the gaseous starting material or a plate 10, 19 having passage openings 10',19', wherein at least one guard electrode 8 is arranged upstream and/or wherein at least one guard electrode 10, 19 is arranged downstream of the plasma electrode 9.

A device, which is characterized in that the gas heating unit 11 has the shape of a plate, a lattice, a meander, or a coil, which heating unit is arranged in particular in a plane extending transversely to the flow in the flow path of the gaseous starting material, wherein the gas heating unit 11 has terminal electrodes 12, 13 for conducting an electric current through the gas heating unit 11.

A device, which is characterized in that the guard electrodes 8, 10, the plasma electrode 9, and/or the gas heater 11 are formed by plates, which each have a plurality of openings, wherein the openings of adjacent plates are arranged offset to one another for the purpose of gas mixing.

A device, which is characterized by one or more plates forming the electrodes 8, 9, 10 and/or the inner side of the wall of the gas inlet opening 2 having the gas outlet openings 7 having heat-reflective properties.

A device, which is characterized in that the gas heating unit 11, which is arranged in a plane, is arranged immediately behind the gas outlet surface 4 in the flow direction of the gas and/or a guard electrode 8 is directly opposite to the substrate 16, wherein the guard electrode 8 has openings 8' for the gas passage.

The device according to one or more of the preceding claims, characterized in that the upper wall 3 of the gas outlet element 2 is an insulator plate 18, along which the plasma electrode 9 extends.

A device, characterized by two guard electrodes 10, 19, which are spaced apart from one another and are arranged inside the housing cavity 5, and which are connected using electrically conductive holding rods 20, 21 to a grounded electrode 8.

A method, which is characterized in that, optionally together with a carrier gas, a mixture containing at least one oxidizing or reducing or carbonaceous gaseous starting material or a cleaning gas is fed through the gas feed line 6 into the housing cavity 5, wherein energy is applied to the gas mixture by the plasma generator 8, 9, 10 and also by the gas heater 11.

A method, which is characterized in that the gaseous starting material is activated and dissociated in the housing cavity simultaneously by the supply of heat generated by the heating unit 11 and by a plasma generated by the plasma generator 8, 9, 10, so that atomic or ionized radicals, gaseous polymers, or aromatic intermediate products form, in particular in the form of radicals.

A method, which is characterized in that the plasma is generated continuously and/or in pulsed form, and/or the gaseous starting material is fed continuously or in pulsed form into the gas inlet element 2.

A method, which is characterized in that, before or after a method step in which nanostructures consisting of carbon are deposited on the substrate 16 arranged in the process chamber, a cleaning step is carried out, during which a cleaning gas fed into the housing cavity 5 is activated by application of a plasma and/or by heating, wherein the cleaning step is carried out in particular periodically before or after a deposition step.

A method, which is characterized in that using elements, which are grounded in particular and are arranged downstream of the plasma electrode 9 and/or the heating unit 13, such as a guard electrode 10 and/or the grounded gas outlet surface 4, particles forming during the conversion reaction are captured.

All disclosed features are essential to the invention (alone, or also in combination with one another). The content of the disclosure of the associated/appended priority documents (copy of the prior application) is hereby also incorporated in its entirety in the disclosure of the application, also for the purpose of including features of these documents in claims of the present application. The dependent claims characterize independent refinements according to the invention of the prior art with their features, in particular to carry out divisional applications based on these claims.

| List of reference numerals | | | |
|---|---|---|---|
| 1 | reactor housing | | |
| 2 | gas inlet element/shower head | | |
| 3 | wall | 3' wall | 3" wall |
| 4 | gas outlet surface | | |
| 5 | housing cavity | | |
| 6 | gas feed line | | |
| 7 | gas outlet opening | | |
| 8 | plates | 8' opening | |
| 9 | plasma electrode/plate | | |
| 10 | plates | 10' opening | |
| 11 | heating element, plate, meander, or coil | | |
| 12 | contact | | |
| 13 | contact | | |
| 14 | high-voltage source | | |
| 15 | heating voltage source | | |
| 16 | substrate | | |
| 17 | susceptor | | |
| 18 | insulator plate | | |
| 19 | plate | 19' opening | |
| 20 | holding rod | | |
| 21 | holding rod | | |
| 22 | holding rod | | |
| 23 | plate | | |
| 24 | holding rods | | |

What is claimed is:

1. A device for depositing nanostructures consisting of carbon, the device comprising:
a gas inlet element formed by a conductive hollow body having (i) a housing cavity enclosed by housing walls, into which a gas feed line opens, through which a gaseous, in particular carbonaceous starting material is fed into the housing cavity and (ii) a gas outlet surface having a plurality of gas outlet openings;
a plasma generator, which has a plasma electrode and a grounded electrode arranged inside of the housing cavity of the gas inlet element, wherein the plasma electrode is configured to receive an electrical voltage, which ignites a plasma, which in turn assists a conversion of a gaseous starting material into a gaseous intermediate product, and wherein the gas outlet openings permit the gaseous intermediate product to exit the housing cavity; and
a gas heating element arranged downstream of the plasma electrode and the grounded electrode and upstream of openings of a first insulator plate arranged between the gas outlet surface and a susceptor, wherein the gas heating element further assists the conversion of the gaseous starting material into the gaseous intermediate product.

2. The device according to claim 1, wherein the gas inlet element is arranged in a process chamber of a chemical vapor deposition (CVD) reactor having the susceptor for that carries one or more substrates, wherein the susceptor is associated with a bottom portion of the process chamber and the gas outlet surface is associated with a cover of the process chamber, which process chamber is configured so that the gaseous intermediate products exiting from the gas outlet surface are transported to the at least one substrate, on which the nanostructures are deposited.

3. The device according to claim 2, wherein the plasma electrode is formed as a lattice or a plate, and is arranged in a flow path of the gaseous starting material or on an upper portion of the housing walls of the gas inlet element.

4. The device according to claim 3, further comprising a plurality of guard electrodes which are formed either as (i) lattices and arranged in the flow path of the gaseous starting material or (ii) plates having passage openings, wherein the plurality of guard electrodes are arranged downstream of the plasma electrode.

5. The device according to claim 1, wherein the gas heating element:
is formed as a plate, a lattice, a meander, or a coil;
is arranged in a flow path of the gaseous starting material; and
has terminal electrodes for conducting an electric current through the gas heating element.

6. The device according to claim 4, wherein the grounded electrodes, the plasma electrode, and the gas heater are formed by plates each having a plurality of openings, wherein the openings of adjacent ones of the plates are arranged offset from one another to facilitate gas mixing.

7. The device according to claim 6, wherein one or more of the plates, which form the grounded electrodes, the plasma electrode and the gas outlet surface have heat-reflective properties.

8. The device according to claim 2, wherein the gas heating element is arranged downstream of the gas outlet surface.

9. The device according to claim 1, wherein an upper portion of the housing walls of the gas outlet element is a second insulator plate, along which the plasma electrode extends.

10. The device according to claim 1, further comprising two guard electrodes, which are spaced apart from one another, arranged inside the housing cavity, and connected using electrically conductive holding rods to the grounded electrode.

11. The device according to claim 1, wherein the gas heating element is held by holding rods at a location downstream of the gas outlet surface, and wherein the holding rods are configured to supply power to the gas heating element.

12. The device according to claim 11, wherein the first insulator plate extends between a surface of the susceptor, which carries one or more substrates, and the gas heating element, wherein the first insulator plate has openings through which the gaseous intermediate product flows downstream towards the one or more substrates lying on the susceptor.

* * * * *